United States Patent
Kilian et al.

(10) Patent No.: US 12,055,587 B2
(45) Date of Patent: Aug. 6, 2024

(54) INTEGRATED TEST CIRCUIT, TEST ASSEMBLY AND METHOD FOR TESTING AN INTEGRATED CIRCUIT

(71) Applicant: Infineon Technologies AG, Neubiberg (DE)

(72) Inventors: Tobias Kilian, Munich (DE); Martin Huch, Munich (DE); Heiko Ahrens, Neubiberg (DE); Daniel Tille, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/947,495

(22) Filed: Sep. 19, 2022

(65) Prior Publication Data
US 2023/0138651 A1    May 4, 2023

(30) Foreign Application Priority Data
Oct. 29, 2021    (DE) .................. 10 2021 128 331.0

(51) Int. Cl.
*G01R 31/3185*   (2006.01)
*G01R 31/28*   (2006.01)
(Continued)

(52) U.S. Cl.
CPC .  *G01R 31/318572* (2013.01); *G01R 31/2856* (2013.01); *G01R 31/3016* (2013.01);
(Continued)

(58) Field of Classification Search
CPC ........ G01R 31/318572; G01R 31/2856; G01R 31/3016; G01R 31/318525;
(Continued)

(56) References Cited

U.S. PATENT DOCUMENTS

| 6,105,153 A | 8/2000 | Yamada |
| 7,265,638 B2 * | 9/2007 | Osvaldella ........... H03K 3/0315 331/177 R |

(Continued)

FOREIGN PATENT DOCUMENTS

DE    102016116717 A1    9/2017

OTHER PUBLICATIONS

Sarkisla et al., Ring Oscillator Based Random No. Generator Using Wake-up and Shut-down Uncertainties, 2018, IEEE, pp. 104-108. (Year: 2018).*

(Continued)

*Primary Examiner* — John J Tabone, Jr.
(74) *Attorney, Agent, or Firm* — Eschweiler & Potashnik,

(57) ABSTRACT

An integrated circuit includes a ring oscillator circuit and a plurality of logic paths. Each logic path comprises a path input connection, a path output connection and an input multiplexer, which has an output connection that is connected to the path input connection of the logic path. Each logic path, beginning with a first logic path, is assigned a respective subsequent logic path by virtue of the path output connection of the logic path being connected to a data input connection of the input multiplexer of the subsequent logic path. A last logic path of the logic paths is assigned the first logic path as subsequent logic path. For each logic path, the multiplexer is configured such that, when a control signal that indicates a test mode is fed thereto, it connects the data input connection of the input multiplexer to the path input connection of the logic path.

20 Claims, 8 Drawing Sheets

(51) Int. Cl.
*G01R 31/30* (2006.01)
*H03K 3/03* (2006.01)

(52) U.S. Cl.
CPC ........ *G01R 31/318525* (2013.01); *G01R 31/318536* (2013.01); *G01R 31/31855* (2013.01); *H03K 3/0315* (2013.01); *G01R 31/318594* (2013.01)

(58) Field of Classification Search
CPC ...... G01R 31/318536; G01R 31/31855; G01R 31/318594; H03K 3/0315
USPC .................. 714/726, 729, 732, 735, 742
See application file for complete search history.

(56) References Cited

U.S. PATENT DOCUMENTS

| | | | | |
|---|---|---|---|---|
| 7,567,136 | B2* | 7/2009 | Osvaldella | H03K 5/133 331/177 R |
| 8,560,980 | B2 | 10/2013 | Xiong et al. | |
| 8,819,615 | B2* | 8/2014 | Le Coz | G06F 30/394 716/132 |
| 9,081,991 | B2 | 7/2015 | Jyothi et al. | |
| 9,097,765 | B1 | 8/2015 | Charlebois et al. | |
| 9,501,604 | B1 | 11/2016 | More et al. | |
| 10,598,728 | B2* | 3/2020 | Fel | G01R 31/318563 |
| 2005/0248415 | A1* | 11/2005 | Osvaldella | H03K 5/133 331/57 |
| 2008/0197876 | A1* | 8/2008 | Borot | G01R 31/31725 702/186 |
| 2008/0309417 | A1* | 12/2008 | Bonwick | G01R 31/31937 327/263 |
| 2014/0132290 | A1 | 5/2014 | Charlebois et al. | |
| 2017/0030967 | A1* | 2/2017 | Warnock | G01R 31/2837 |
| 2023/0079599 | A1* | 3/2023 | Kilian | G01R 31/318555 714/726 |
| 2023/0138651 | A1* | 5/2023 | Kilian | H03K 3/0315 714/726 |

OTHER PUBLICATIONS

Liang et al., A novel BIST scheme for circuit aging measurement of aerospace chips, Apr. 28, 2018, Chinese Journal of Aeronautics, pp. 1594-1601. (Year: 2018).*

K. Wang, M. Tehranipoor and R. Datta, "Path-RO: A novel on-chip critical path delay measurement under process variations," 2008 IEEE/ACM International Conference on Computer-Aided Design, 2008, pp. 640-646, doi: 10.1109/ICCAD.2008.4681644.

X. Wang, M. Tehranipoor and R. Datta, "A novel architecture for on-chip path delay measurement," 2009 International Test Conference, 2009, pp. 1-10, doi: 10.1109/TEST.2009.5355742.

* cited by examiner

INTEGRATED TEST CIRCUIT, TEST ASSEMBLY AND METHOD FOR TESTING AN INTEGRATED CIRCUIT

REFERENCE TO RELATED APPLICATIONS

This application claims priority to German Patent Application 10 2021 128 331.0, filed on Oct. 29, 2021. The contents of the above-referenced Patent Application is hereby incorporated by reference in its entirety.

TECHNICAL FIELD

Exemplary embodiments relate generally to integrated circuits, test assemblies and methods for testing integrated circuits.

SUMMARY

Integrated circuits, for example microcontrollers (MCUs) such as for vehicles, for instance, have to meet high quality standards. Because of this, they are tested extensively. One area of testing is performance screening. The performance of an integrated circuit is in this case the maximum clock frequency of the integrated circuit in the worst case (that is to say worst-case conditions). A circuit (for example a chip) that does not pass the performance screening is typically eliminated.

However, the performance, for example of a microcontroller, depends on many device parameters and environmental conditions. For a direct performance measurement, a comprehensive test at system level would be required in order to test each case of application in which the microcontroller is used. However, microcontrollers are mass-produced products with a high cost pressure, while the test system level is associated with a high degree of outlay and huge test costs.

Therefore, test structures are conventionally used to measure the performance indirectly. If an indirect measurement is used to determine a parameter (such as the performance here), the accuracy of the measurement depends greatly on the quality of the test structures. A type of test structure that can be used to achieve a high degree of accuracy is a ring oscillator (ROs), in particular a functional ring oscillator that is formed from gates present in the integrated circuit for the normal functioning thereof. In this case, suitable side inputs for the gates of scan flip-flops are supplied, the side inputs being provided in the integrated circuit (for example to carry out other test and for normal operation) in order that the gates form a logic path.

However, the implementation of ring oscillators (even functional ring oscillators) in high numbers in an integrated circuit typically leads to considerable overheads, in particular routing outlay. Therefore, more efficient approaches to testing the performance of integrated circuits are desirable.

One exemplary embodiment provides an integrated circuit, comprising at least one ring oscillator circuit, comprising a plurality of logic paths, wherein each logic path comprises a path input connection, a path output connection and an input multiplexer, which has an output connection that is connected to the path input connection of the logic path, wherein each logic path of the logic paths, beginning with a first logic path, is assigned a respective subsequent logic path by virtue of the path output connection of the logic path being connected to a data input connection of the input multiplexer of the subsequent logic path, wherein a last logic path of the logic paths is assigned the first logic path as subsequent logic path and wherein, for each logic path, the multiplexer is set up in such a way that, when a control signal that indicates a test mode is fed thereto, it connects the data input connection of the input multiplexer to the path input connection of the logic path.

Further embodiments provide a test assembly and a method for testing an integrated circuit as described above.

BRIEF DESCRIPTION OF THE DRAWINGS

The figures do not represent the actual scales but are intended to used to illustrate the principles of the various exemplary embodiments. Various exemplary embodiments are described in detail below with reference to the following figures.

DESCRIPTION

The following detailed description relates to the appended figures, the details and exemplary embodiments. These exemplary embodiments are described in detail so that a person skilled in the art can execute the invention. Other embodiments are also possible and the exemplary embodiments can be changed in structural, logic and electrical terms without departing from the subject matter of the invention. The various exemplary embodiments are not necessarily mutually exclusive but various embodiments can be combined with one another to produce new embodiments. Within the scope of this description, the terms "linked," "connected," and "coupled" are used to describe both a direct and an indirect link, a direct or indirect connection, and direct or indirect coupling.

Figure 1:
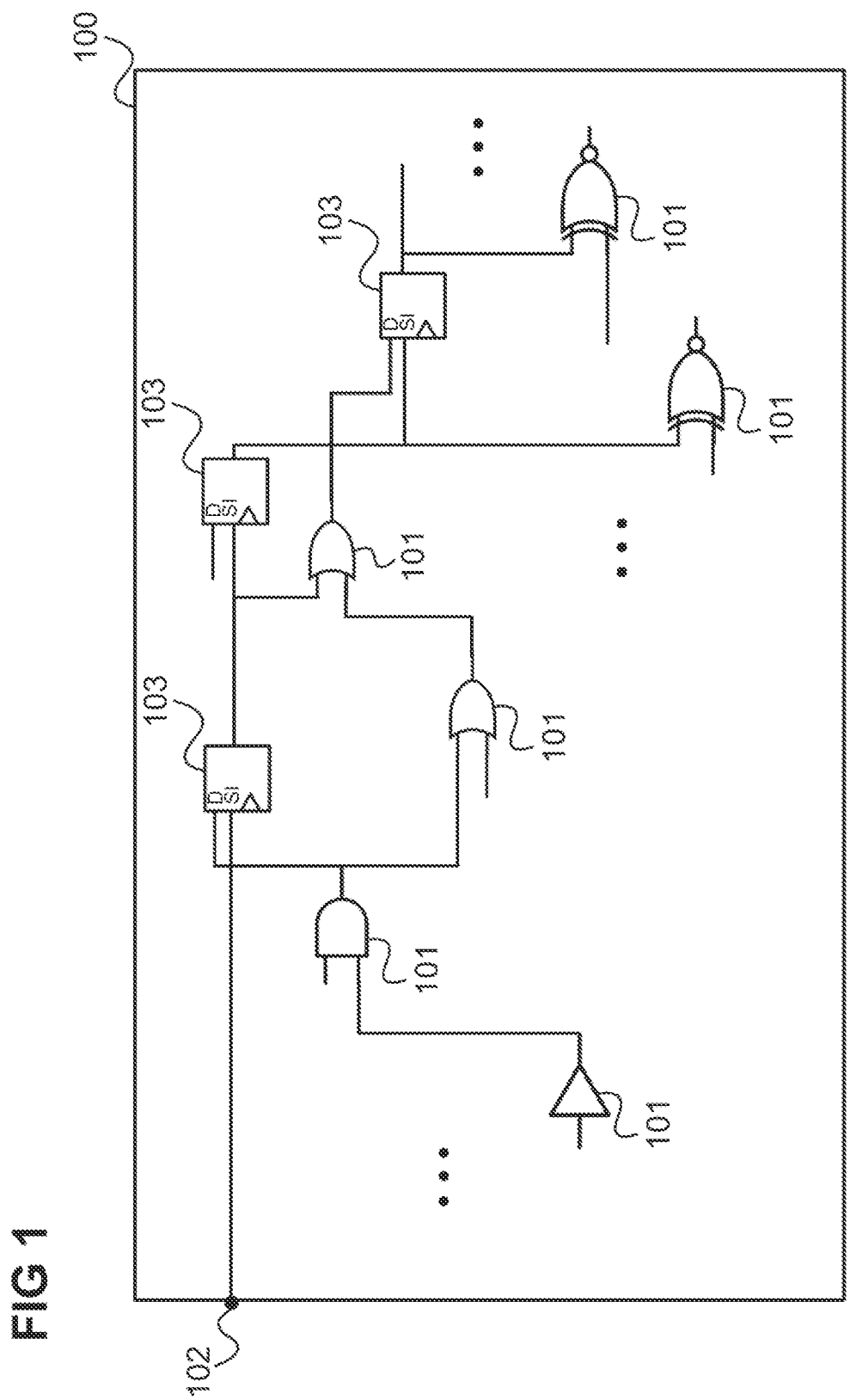
FIG. 1 shows an integrated circuit (or a chip) according to one embodiment.

FIG. 1 shows an integrated circuit (or a chip) 100 according to one embodiment.

By way of example, the integrated circuit 100 is a microcontroller, for example for an ECU (electronic control unit) in a vehicle or else a chip card module for a chip card of any form factor.

As is typically the case, the integrated circuit 100 comprises a multiplicity of logic gates 101 (AND gates, NOR gates, exclusive OR gates, inverters, etc.) that are connected to one another via connecting lines. The logic gates 101 are cells from a chip design library and they may also be more complex circuits (for example complex gates).

The integrated circuit also comprises flip-flops 103 that are connected to the logic gates 101. At least a portion of the flip-flops 103 are provided as scan flip-flops in order to be able to load test patterns for testing the integrated circuit into the scan flip-flops. A scan flip-flop is a D flip-flop with a multiplexer added at the input connection, wherein an input connection of the multiplexer functions as functional input connection D and the other input connection is used as scan-in input connection (SI). The test pattern is pushed into the flip-flops 103 (in each case via the scan-in input connection) for example by way of one or more test input pins 102. A scan enable signal (or test enable signal, not shown in FIG. 1) switches the multiplexer of the scan flip-flop for the testing from the data input connection (D) to the scan-in input connection (SI). The scan enable signal is a general signal that is the same for all scan flip-flops (it therefore does not need to be routed separately).

One possibility for measuring the performance is to use a chain of logic gates 101 (or generally cells) that are already present in the integrated circuit 100 to form a ring oscillator.

Figure 2:
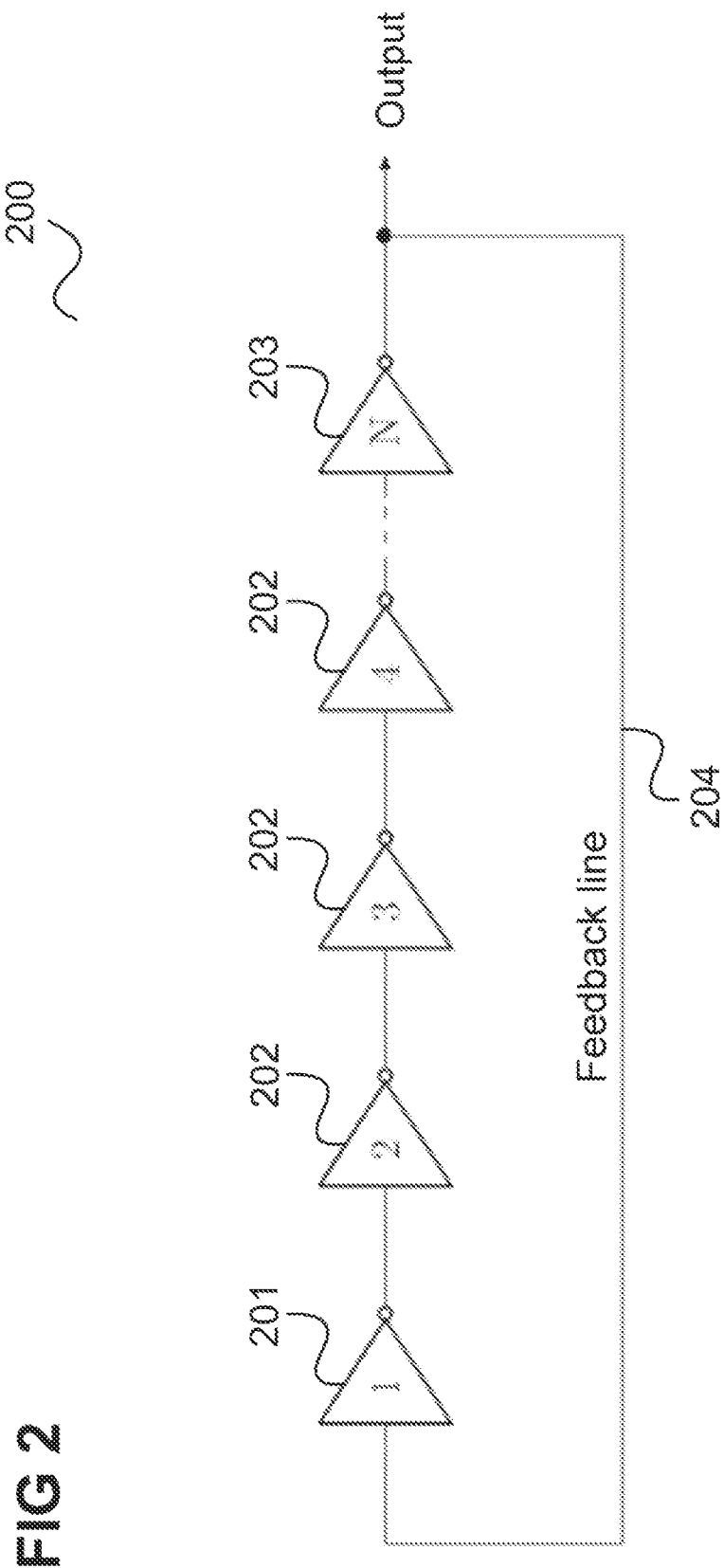
FIG. 2 shows a ring oscillator.

FIG. 2 shows a ring oscillator 200.

The ring oscillator 200 comprises a chain of logic gates 201, 202, 203 (generally cells) connected in series. Each logic gate 201, 202, 203 comprises an input connection and an output connection using which said gate is interconnected in the chain, wherein the output connection of the last logic gate 203 of the chain is connected to the input connection of the first logic gate 201 via a feedback line (or feedback connection) 204. The other input connections of the logic gates 201, 202, 203 (for example the second input connection of a NAND gate or the second input connection of a NOR gate), subsequently referred to as side input connections, are set to a fixed value so that each logic gate 201, 202, 203 forms an inverter with respect to the input connection and output connection using which said gate is interconnected in the chain. If the number of logic gates N is uneven, the chain thus has an overall inverting effect and the loop formed by the feedback line 204 together with the chain oscillates.

The inputs for the side input connections of the logic gates 201, 202, 203 that cause them to function as inverters are referred to as side inputs. The side inputs together form a side input pattern. The side inputs are supplied by scan flip-flops 103 that are suitably loaded (through storage of a suitable test pattern that contains the side input pattern in the scan flip-flops). If it is not possible for a gate with a suitable side input to be made to function as an inverter (for example an AND gate), the side input is selected so that it has a non-inverting effect (that is to say simply as a buffer) and either the number of logic gates 201, 202, 203 is adjusted or an inverter is provided in the feedback line, with the result that an inverting response results again overall and the loop oscillates.

The frequency of this oscillation, that is to say the oscillation frequency of the ring oscillator formed in this way, can be observed and used to test the performance of the integrated circuit 100. The quality of the testing depends on the information content of the oscillation frequency of the ring oscillator 100, that is to say it must represent the timing behavior (and thus the performance) of the entire chip as far as possible. However, the oscillation frequency typically correlates well with the performance of the integrated circuit, in particular when the chain of logic gates that is formed corresponds well to the design of the chip. Nevertheless, a high number of ring oscillators is typically required.

The ring oscillator described with reference to FIG. 2 is what is known as a functional ring oscillator, that is to say a functional path ring oscillator, that is to say it is formed as mentioned above from logic gates 101 that are present in the integrated circuit (for the normal functioning thereof, that is to say normal operation in contrast to test operation). This prevents the ring oscillators leading to additional outlay in terms of area and energy, as is the case when they are formed from additional logic gates (that is to say not from logic gates that are present anyway).

Figure 3:
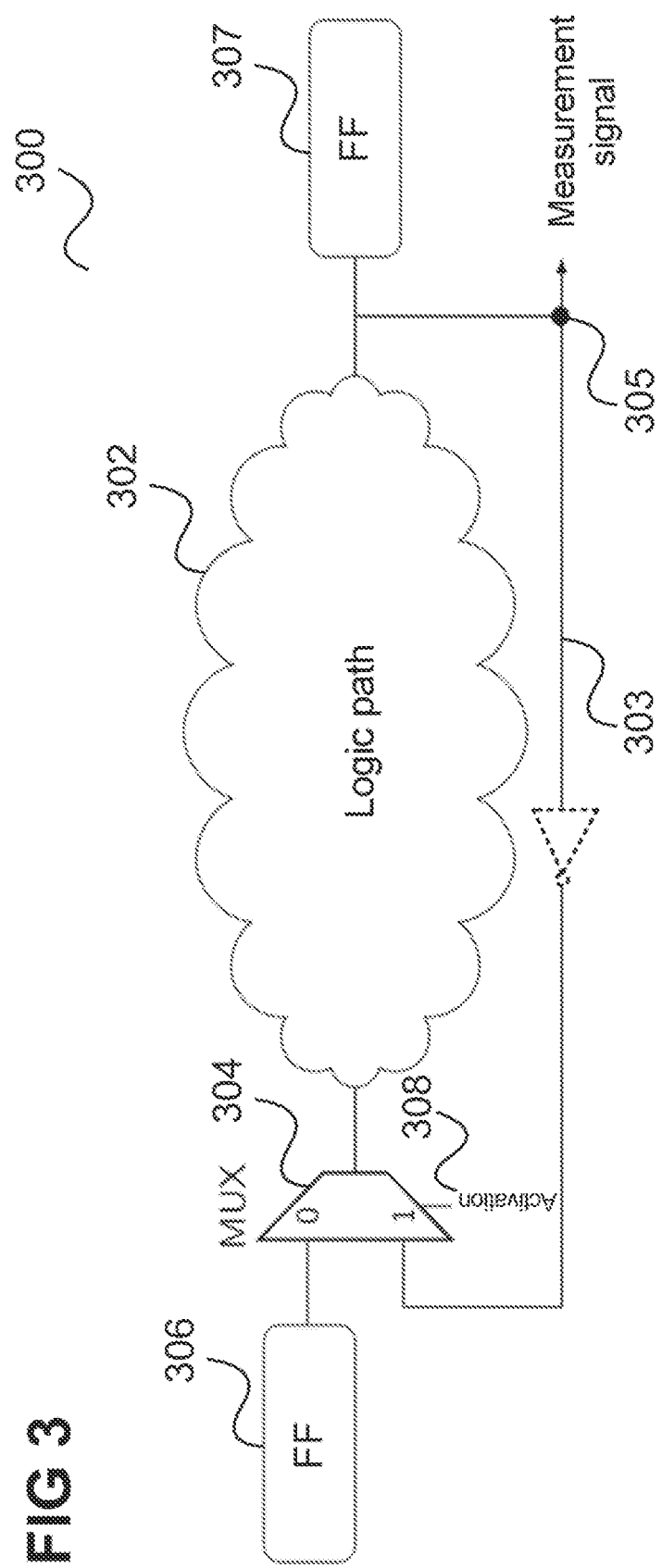
FIG. 3 shows a circuit for forming a functional ring oscillator in an integrated circuit.

FIG. 3 shows a circuit for forming a functional ring oscillator in an integrated circuit.

As is described with reference to FIG. 2, a combinational logic path 302 (that is to say a functional path) is formed by a chain of logic gates that are suitably supplied with side inputs. The feedback is effected via a feedback line 303 (which is provided with an inverter if the combinational logic path 302 is not self-inverting) that is connected to an input connection of an (input) multiplexer 304.

As explained above, the basic idea of a functional ring oscillator can be considered that of using a functional combinational logic path 302 that is present for the normal functioning of the integrated circuit (that is to say as per design) in order to form the ring oscillator.

The multiplexer 304 at the input connection of the path makes it possible to switch over from the functional mode (that is to say the use of the logic path 302 for normal operation, in this case input "0" of the multiplexer) to the oscillation mode in which the multiplexer 304 feeds the signal of the feedback line to the logic path 302 (in this case input "1" of the multiplexer 304). For normal operation, the multiplexer 304 connects for example an input signal from an input-side flip-flop 306 (that may also be from a memory or register) through to the logic path 302. The output of the logic path 302 goes to an output-side flip-flop 307 (for example of a memory or register). The input-side flip-flop 306 is also referred to as a launch flip-flop.

The oscillation frequency of the ring oscillator can be observed via a measurement terminal 305.

As explained above, suitable side inputs are applied to the logic gates that form the logic path 302 in order to form the logic path 302. To this end, an industrial automatic test pattern generation (ATPG) tool can be used in path delay mode. The ATPG tool is executed on a test apparatus (that is to say a test computer) and provides test patterns to the integrated circuit via the test pin 102. The ATPG tool thus sensitizes the logic path 302 by setting all side inputs to stable values.

In this way, the testing by means of functional ring oscillators can be easily integrated into a conventional industrial test procedure by applying design for testing (DFT) methods.

The functional ring oscillators represent the actual chip behavior well without producing much overhead in terms of area. Only the multiplexer 304 and the feedback line 303 are additionally required to form the ring oscillator.

Each functional ring oscillator on the chip can be activated by an individual, central control signal 308 ("enable" signal) that is fed in the integrated circuit to the multiplexer 304. This control signal is individual for the functional ring oscillator since not all of the ring oscillators are to be activated at the same time during testing. There is therefore a high degree of routing outlay for the lines for the control signal 308 in this procedure. This can be prevented by an architecture in which the ring oscillators activate themselves. In this case, a portion of the scan flip-flops present in a chip is used to activate ring oscillators, wherein different scan flip-flops for activation are used for different ring oscillators. This removes the need for a control connection to a central control device on the chip.

However, further routing outlay is produced by virtue of the fact that the observation signal has to be routed from an output connection 305 for the frequency measurement at a GPIO pin via the chip to the GPIO pin and for the feedback line 303 that connects the end point (output connection) to the starting point (input connection) of the logic path 302.

Figure 4:
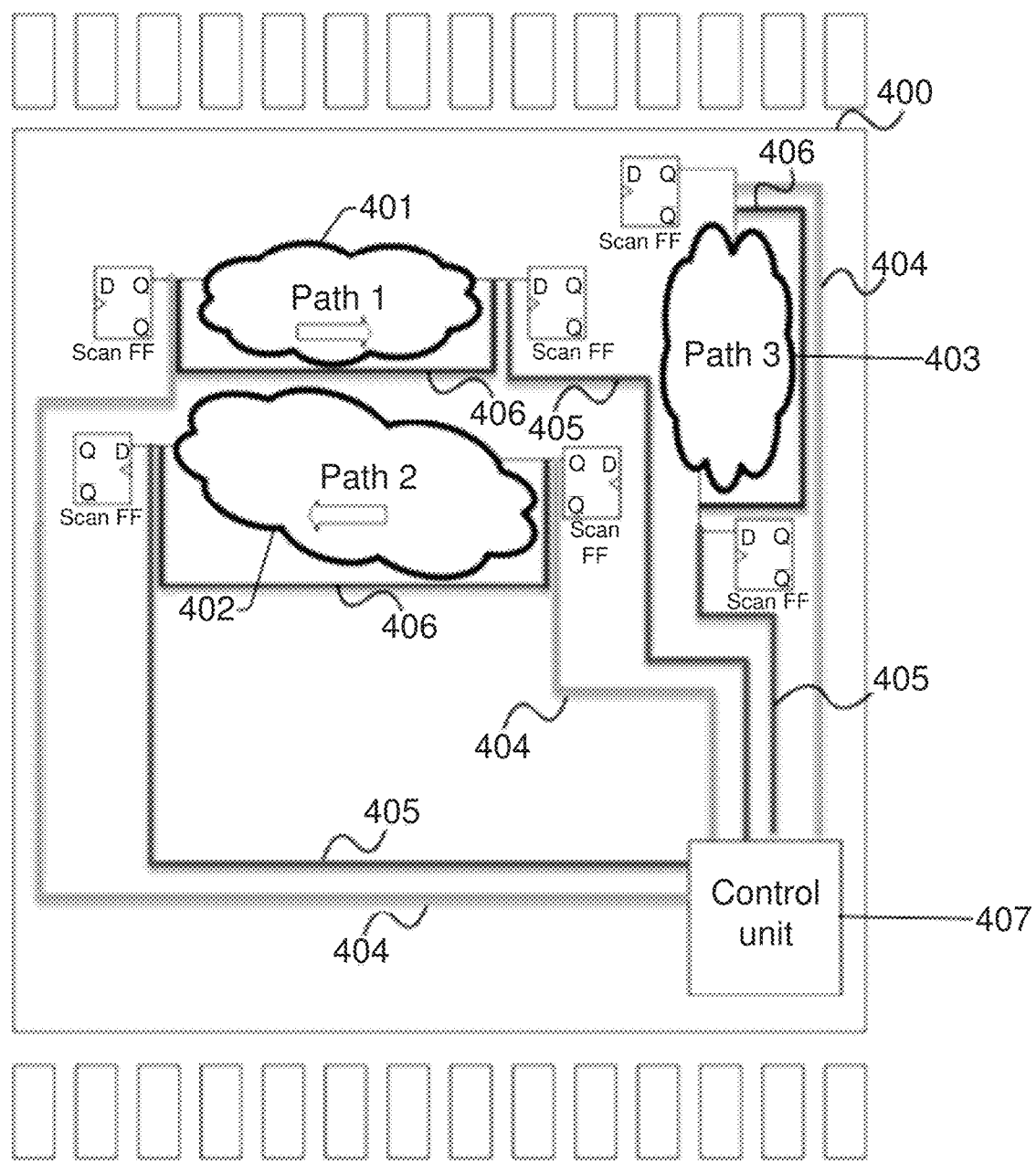
FIG. 4 shows the routing outlay on a chip when implementing three functional ring oscillators from three logic paths.

FIG. 4 illustrates the routing outlay on a chip 400 when implementing three functional ring oscillators from three logic paths 401, 402, 403 through the lines for the enable signal 404, the lines for the observation signals 405 and the feedback lines 406. The multiplexers at the input connections of the logic paths 401, 402, 403, to which the lines for the enable signal 404 and the feedback lines 406 lead, are not illustrated for the sake of simplicity.

In this example, the lines for the enable signal 404 and the lines for the observation signals 405 are both connected to a central control unit 407. The lines for the observation signals 405 can also lead to an output connection pin, which is arranged at a different location to the central control unit 407. However, the routing outlay remains similar in this case.

In the case of few ring oscillators on a chip, the routing outlay plays a small role. On account of the process variation, in particular the variation within a chip, in modern CMOS technologies, however, a lot of test structures that are distributed over the chip are typically required in order to cover the fluctuations due to the process variations and to detect the overall performance of the chip. However, the addition of more, for example hundreds, of ring oscillators on a chip results in a high routing outlay. Furthermore, the test duration has to be short in order to reduce the test costs.

Ultimately, there is a compromise between the number of test structures (that is to say in this case the ring oscillators) and the high routing outlay for the test structures.

In particular, the feedback lines 406 produce a considerable amount of routing outlay, particularly for logic paths 401, 402, 403 that extend over long distances to the chip 400. In this case, furthermore, additional buffers are typically required in order to achieve suitable edge gradients. Depending on the length of the feedback lines, this leads to additional required logic circuits.

Various embodiments provide a procedure that reduces the routing outlay of functional ring oscillators.

According to various exemplary embodiments, this is achieved by virtue of two or more logic paths 401, 402, 403 being combined so that a functional ring oscillator is formed without a long feedback line being required. This clearly takes place by virtue of (at least a large part of) a feedback line being replaced by a logic path and thus not being additionally required. That is to say, logic paths clearly form both the outgoing and return direction in such a ring oscillator, which is also referred to in the following text as "natural loop" ring oscillator, that is to say as a ring oscillator that is formed by a loop whose component parts are "natural", that is to say are present on the chip anyway according to the function provided for the chip. The routing outlay can be further reduced by this approach being combined so that self-activation of the functional ring oscillators is provided.

As mentioned above, a logic path 302 is sensitized by means of an ATPG tool by virtue of all of the side inputs of the logic gates that form the logic path 302 being set to a static value, with the result that an oscillation signal can be produced in or can pass through the ring oscillator that is formed by the logic path. This sensitization is carried out by means of a robust path delay pattern, which is loaded (for example shifted) into a set of scan flip-flops by the ATPG tool.

The range of such ATPG path delay patterns is typically large enough so that sufficient degrees of freedom are present so that all of the side inputs for logic paths that are used to form functional ring oscillators can be selected suitably (and do not contradict one another for example for a ring oscillator). An ATPG path delay pattern that is selected to sensitize a logic path for a ring oscillator on a chip typically sensitizes several logic paths on the chip. It is then possible to make a selection from all of these sensitized logic paths, in particular in order to form a natural loop, that is to say to replace at least a portion of the feedback for the logic path for the sensitization of which the ATPG path delay pattern has actually been selected.

Figure 5:
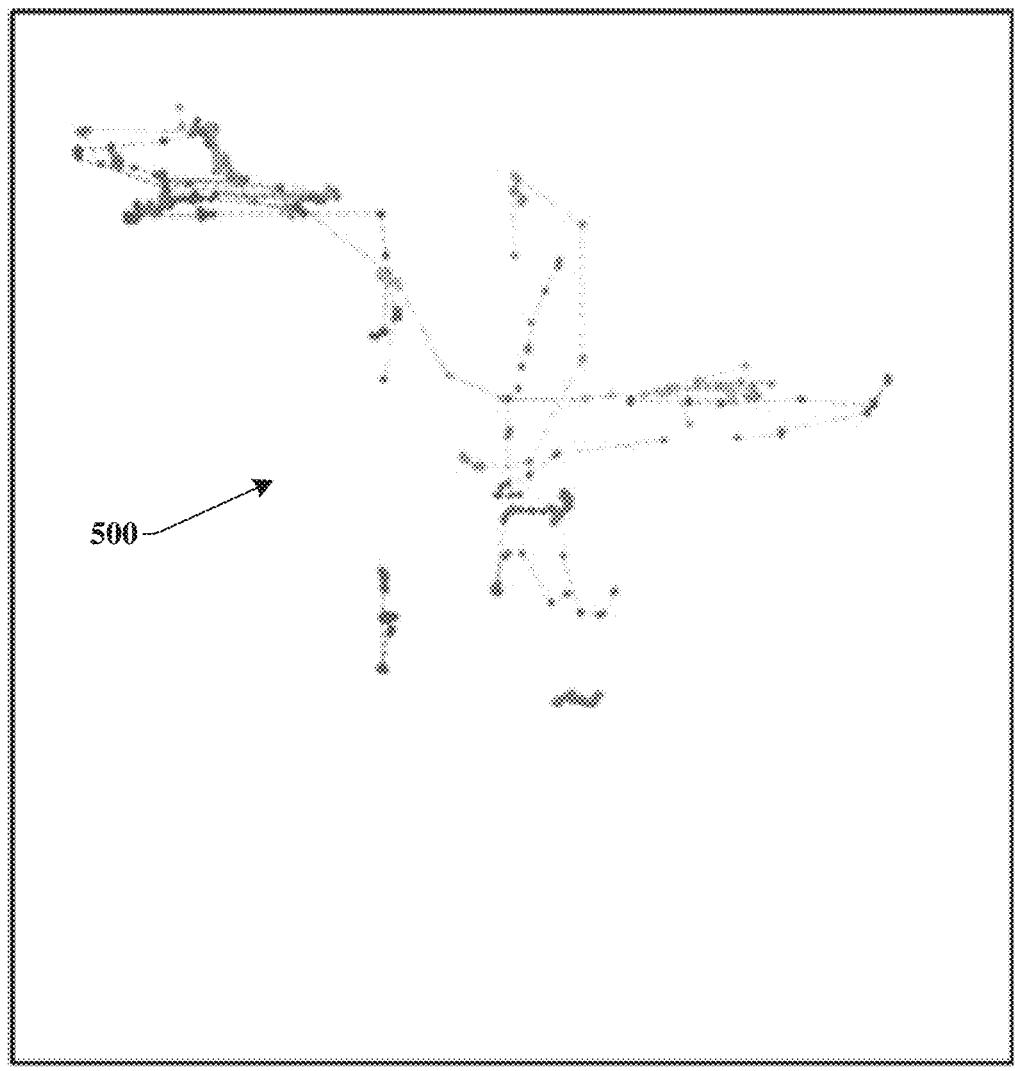
FIG. 5 shows an example of a subset of the logic paths of a chip that are sensitized by a single path delay pattern.

FIG. 5 shows an example 500 of a subset of the logic paths of a chip that are sensitized by a single ATPG path delay pattern.

As can be seen in the example of FIG. 5, the logic paths from which a selection can be made are distributed over the chip and have different lengths.

Figure 6:
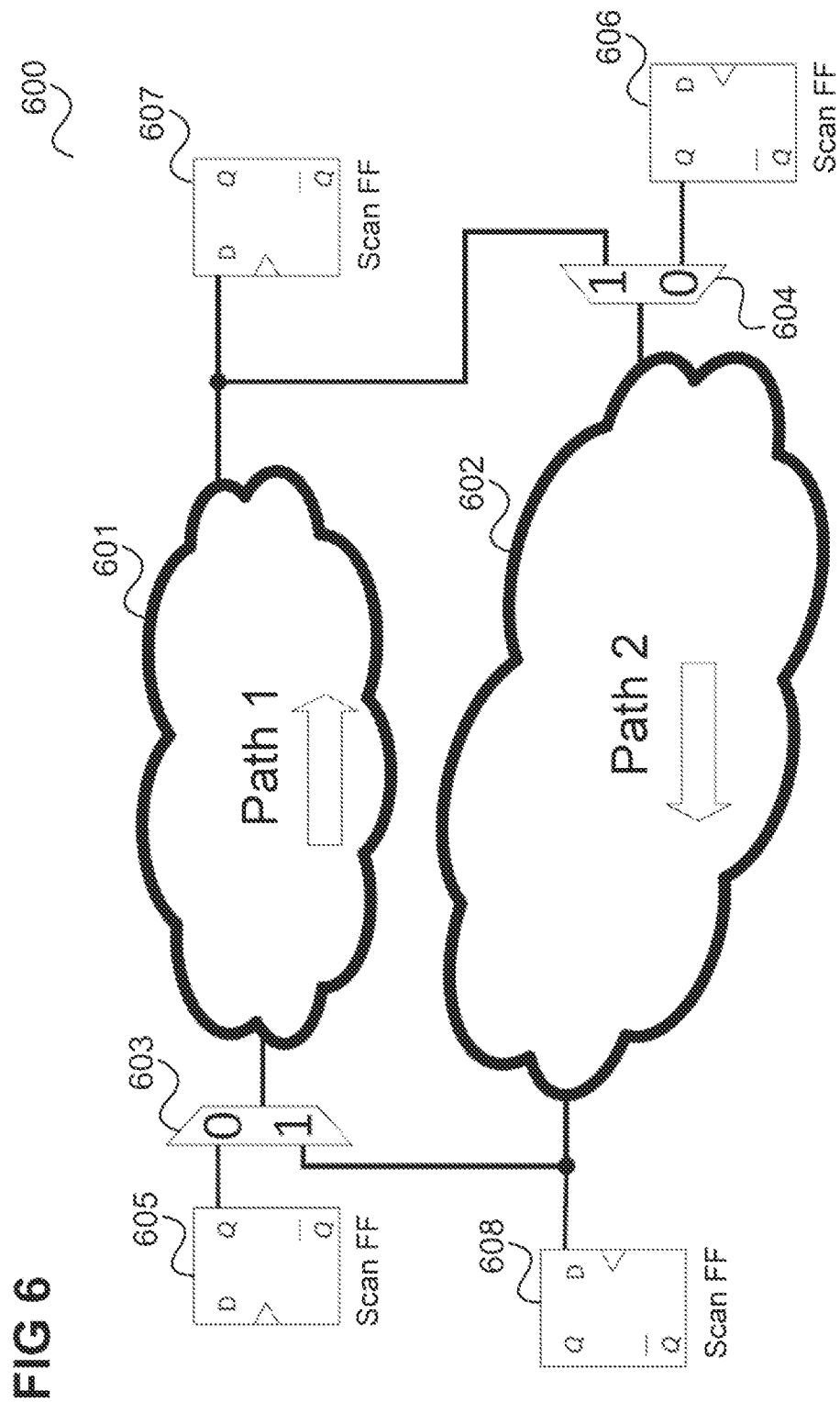
FIG. 6 shows a natural loop ring oscillator according to one embodiment.

In accordance with one embodiment, in the simplest case, use is made of two logic paths that are sensitized by the same ATPG path delay pattern and that run in a different direction to the one illustrated in FIG. 6.

FIG. 6 shows a natural loop ring oscillator 600 according to one embodiment.

The natural loop ring oscillator 600 has a first (combinational) logic path 601 and a second (combinational) logic path 602, these each being formed by a chain of logic gates that are suitably supplied with side inputs (that is to say so that the logic paths 601, 602 are sensitized).

A respective multiplexer 603, 604 is provided on the input side for each logic path 601, 602, said multiplexer making it possible to switch over from the function mode (that is to say the use of the logic path for normal operation, in this case input "0" of the multiplexer) to the oscillation mode.

For normal operation, the multiplexer 603, 604 connects an input signal from a respective input-side (launch) flip-flop 605, 606 (that may also be from a memory or register) through to the logic path 601, 602. The output of each logic path 601, 602 goes to a respective output-side flip-flop 607, 608 (for example of a memory or register).

The output connection of the first logic path 601 is connected to the data input connection of the input multiplexer 604 of the second logic path 602 that the multiplexer 604 connects through (in this case input "1" of the multiplexer 604) in the oscillation mode (that is to say in the test mode). Analogously, the output connection of the second logic path 602 is connected to the data input connection of the input multiplexer 603 of the first logic path 601 that the multiplexer 603 connects through (in this case input "1" of the multiplexer 603) in the oscillation mode. A loop is thus formed in the oscillation mode, wherein the two directions of the loop are formed by the two logic paths 601, 602.

The formation of ring oscillators by means of natural loops can significantly reduce the routing outlay.

Figure 7:
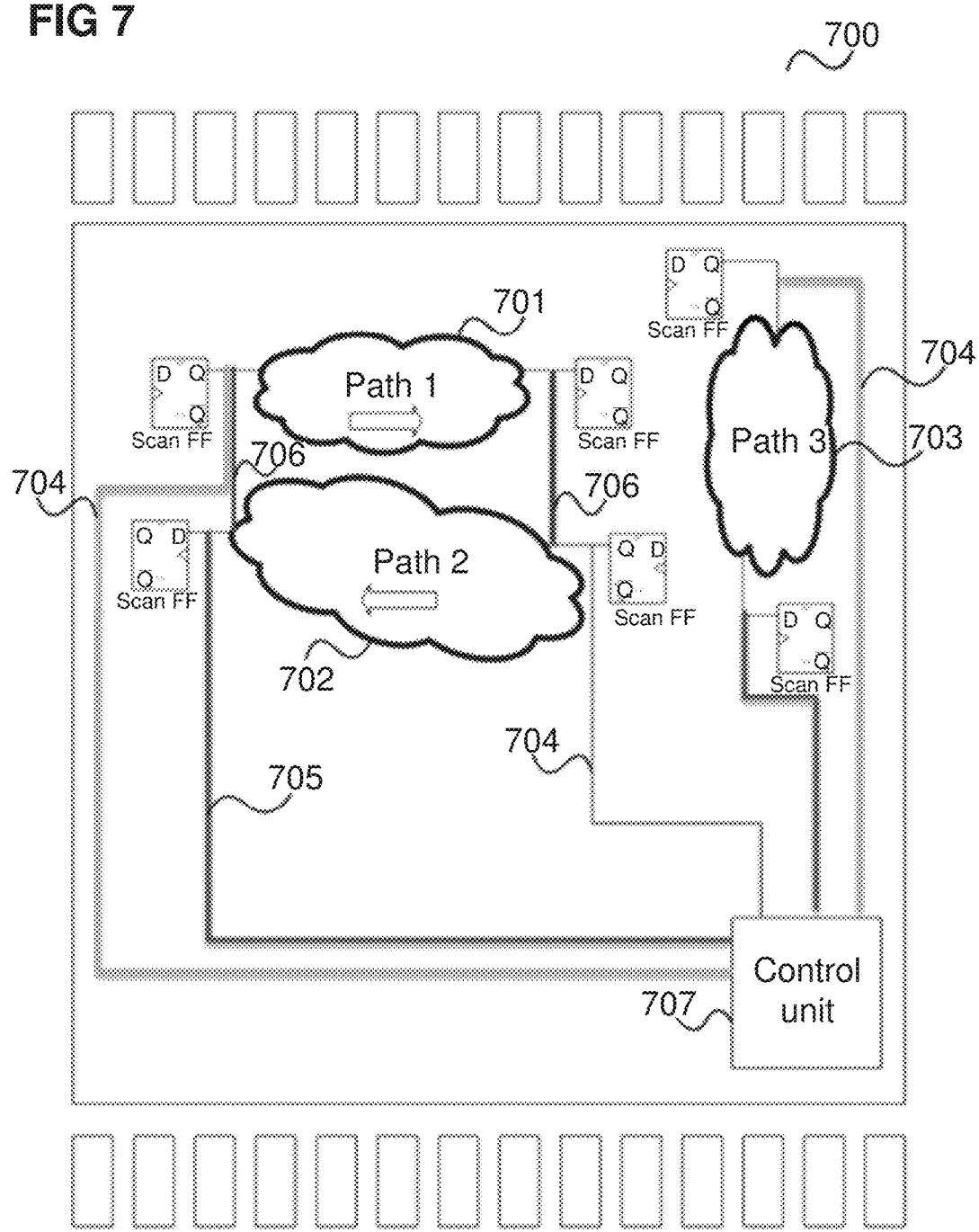
FIG. 7 shows the reduction in the routing outlay in the example of FIG. 4.

FIG. 7 shows the reduction in the routing outlay in the example of FIG. 4.

As is described with reference to FIG. 6, a natural loop ring oscillator composed of two logic paths 701, 702 on a chip 700 is formed (the two logic paths corresponding to the logic paths 401, 402 of FIG. 4 on the chip 400).

Instead of the feedback lines 406 for the two logic paths 401, 402, only short lines 706 are required to connect the output connection of the first logic path 701 to the input multiplexer of the second logic path 702 and to connect the output connection of the second logic path 702 to the input multiplexer of the first logic path 701. As in FIG. 4, the multiplexers at the input connections of the logic paths 701, 702, 703 are not illustrated for the sake of simplicity.

Furthermore, in this example, the observation line 405 from the output connection of the first logic path 401, 701 to the central control unit 407, 707 is omitted. The observation line 705 can be provided at a suitable point of the entire ring oscillator, for example so that the routing outlay for this remains low. The lines for the enable signal 704 to the central control unit 707 can be avoided by switching the input multiplexer by means of self-activation.

The procedure of forming functional ring oscillators by means of natural loops that is described above is advantageous particularly for long logic paths, which would require a long feedback line and many buffers along the feedback line. It should be noted that a natural loop can also be formed from more than two logic paths when it is advantageous, from a routing outlay point of view, to connect three or more logic paths.

The formation of functional ring oscillators by means of natural loops also makes it possible to average the arising voltage drop, which may distort the measurement. The oscillation frequency is measured specifically in a test mode in which it is possible for an additional voltage drop to arise between chip partitions that are active only in the test mode. The natural loops average the influence of the voltage drop and reduce the errors caused thereby.

Furthermore, the oscillation frequency is reduced when two or more logic paths are combined with one another. There is a maximum frequency that the chip physically supports as per design. The oscillation frequency of ring oscillators should accordingly lie below these physical limits. When logic paths having a short delay are used, the oscillation frequency is very high, however. Since the use of natural loops means that the ring oscillators have a longer logic path (in the example of FIG. 6, the first logic path 601 plus the second logic path 602), the oscillation frequency is reduced and also short logic paths that are part of a natural loop can be monitored.

The procedure of forming natural loops on logic paths is also able to be applied to bus connections of a data bus on the chip when the bus has a unidirectional line in both directions. A data bus transmits data signals via the chip. These data bus signals can also dominate the maximum performance of the chip. A bus with unidirectional lines has an outgoing line (transmission line) and a return line (reception line). Therefore, a natural line ring oscillator can be formed by virtue of the two lines being connected in accordance with the procedure described above. In this case, the transmission line and the reception line (that consist of chains of buffers, for example) are used to form a loop.

Figure 8:
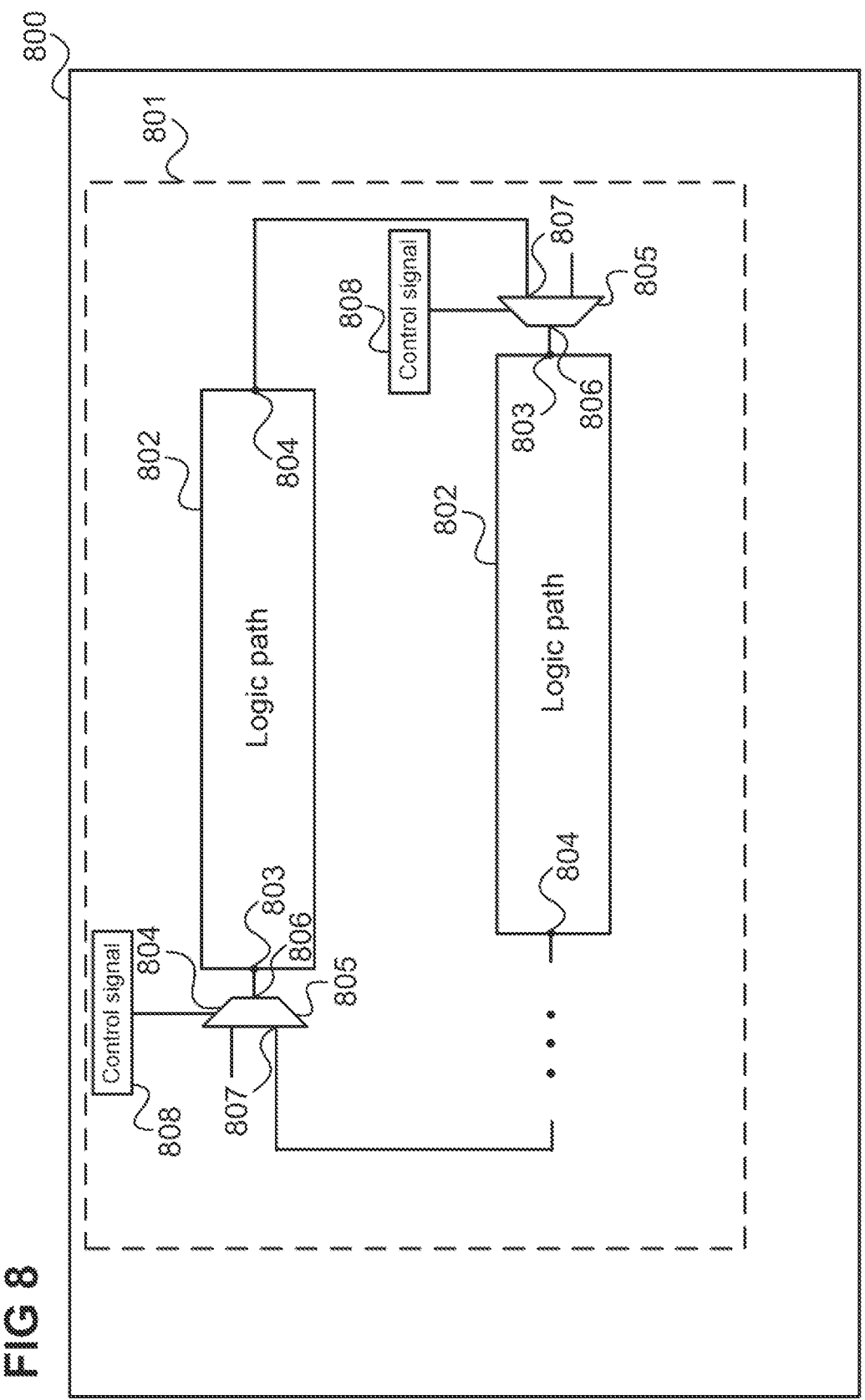
FIG. 8 shows an integrated circuit according to one embodiment.

In summary, according to various embodiments, an integrated circuit (for example a chip) is provided, as is illustrated in FIG. 8.

FIG. 8 shows an integrated circuit 800.

The integrated circuit comprises at least one ring oscillator circuit 801.

The ring oscillator circuit 801 comprises a plurality of logic paths 802, wherein each logic path comprises a path input connection 803, a path output connection 804 and an input multiplexer 805, which has an output connection 806 that is connected to the path input connection 803 of the logic path.

Each logic path of the logic paths 802, beginning with a first logic path, is assigned a respective subsequent logic path by virtue of the path output connection 804 of the logic path being connected to a data input connection 807 of the input multiplexer 805 of the subsequent logic path, wherein a last logic path of the logic paths is assigned the first logic path as subsequent logic path.

The input multiplexer 805 is set up in such a way that, when a control signal 808 that indicates a test mode is fed to it (at the control input connection thereof), it connects the data input connection 807 to the path input connection 803 of the logic path (with which it is associated).

In other words, a ring oscillator is formed by virtue of a plurality of logic paths being connected one behind the other in the test mode so that a loop is produced (and thus no feedback line is required).

In the normal operating mode (that is to say the non-test mode), the logic paths that are connected one behind the other in the test mode are decoupled, for example. In other words, logic paths that are not (at least not directly) connected in the normal operating mode, that is to say do not (directly) interact, are connected one behind the other for the testing, that is to say none of the logic paths obtains a result of a processing of another logic path. The logic paths are bit-logic paths according to various embodiments.

As explained above, the procedure of FIG. 8 makes it possible to reduce the routing outlay (which is important in particular for a high number of ring oscillators and thus improves the scalability, that is to say enables a higher number of test structures), to average the voltage drop and to keep the arising oscillation frequencies low, with the result that more functional logic paths can be monitored.

Various exemplary embodiments are stated below.

Exemplary embodiment 1 is an integrated circuit, as described with reference to FIG. 8.

Exemplary embodiment 2 is an integrated circuit according to exemplary embodiment 1, wherein each logic path comprises a chain of a plurality of logic gates connected one behind the other and/or comprises a data bus line.

Exemplary embodiment 3 is an integrated circuit according to exemplary embodiment 1 or 2, wherein the input multiplexer comprises another data input connection and is set up so that, when a control signal that indicates a normal operating mode is fed thereto, it connects the other data input connection to the path input connection of the logic path.

Exemplary embodiment 4 is an integrated circuit according to one of exemplary embodiments 1 to 3, wherein the input multiplexer is a 2-to-1 multiplexer.

Exemplary embodiment 5 is an integrated circuit according to one of exemplary embodiments 1 to 4, wherein the at least one ring oscillator comprises a test output connection and the integrated circuit comprises a test terminal to which the test output connection is connected.

Exemplary embodiment 6 is an integrated circuit according to exemplary embodiment 5, wherein the test output connection is arranged between one of the logic paths and the following logic path.

Exemplary embodiment 7 is an integrated circuit according to one of exemplary embodiments 1 to 6, wherein each logic path of the plurality of logic paths comprises a chain of a plurality of logic gates connected one behind the other and wherein the at least one ring oscillator circuit is assigned one or more scan flip-flops, which are connected to the input connections of at least a portion of the logic gates of the chains of logic gates of the ring oscillator circuit in such a way that, when they store a predefined side input pattern, for each logic path of the ring oscillator circuit, the logic gates of the chain of the logic path form a serial 1-bit logic path from an input connection of the first logic gate of the chain of the logic path to the output connection of the last logic gate of the chain of the logic path.

Exemplary embodiment 8 is an integrated circuit according to one of exemplary embodiments claims 1 to 7, wherein each logic path is assigned a scan flip-flop group, which contains at least one scan flip-flop, wherein the input multiplexer of the logic path is controller in a manner depending on a bit stored by the at least one scan flip-flop of the scan flip-flop group assigned to the logic path in such a way that it connects the data input connection of the input multiplexer to the path input connection of the logic path.

Exemplary embodiment 9 is an integrated circuit according to one of exemplary embodiments 1 to 8, comprising a multiplicity of ring oscillator circuits, wherein each ring oscillator circuit comprises: a plurality of logic paths, wherein each logic path comprises a path input connection, a path output connection and an input multiplexer, which has an output connection that is connected to the path input connection of the logic path, wherein each logic path of the logic paths, beginning with a first logic path, is assigned a respective subsequent logic path by virtue of the path output connection of the logic path being connected to a data input connection of the input multiplexer of the subsequent logic path, wherein a last logic path of the logic paths is assigned the first logic path as subsequent logic path, wherein, for each logic path, the multiplexer is set up in such a way that, when a control signal that indicates the test mode is fed thereto, it connects the data input connection of the input multiplexer to the path input connection of the logic path.

Exemplary embodiment 10 is an integrated circuit according to exemplary embodiment 9, wherein each logic path of each ring oscillator circuit is assigned a scan flip-flop group, which contains at least one scan flip-flop, wherein the input multiplexer of the logic path is controller in a manner depending on a bit stored by the at least one scan flip-flop of the scan flip-flop group assigned to the logic path in such a way that it connects the data input connection of the input multiplexer to the path input connection of the logic path, wherein the logic paths of different ring oscillator circuits are assigned different scan flip-flop groups.

Exemplary embodiment 11 is a test assembly for testing an integrated circuit according to exemplary embodiment 9 or 10, which is set up, for each ring oscillator circuit and each logic path, to feed the control signal that indicates the test mode to the input multiplexer of the logic path of the ring oscillator circuit and to receive measurement signals generated by the ring oscillator circuits in the test mode.

Exemplary embodiment 12 is a test assembly according to exemplary embodiment 11, comprising an analysis device that is set up to ascertain a performance of the integrated circuit from the oscillation frequencies of the measurement signals received.

Exemplary embodiment 13 is a method for testing an integrated circuit according to exemplary embodiment 9 or 10, comprising: for each ring oscillator circuit and each logic path, feeding the control signal that indicates the test mode to the input multiplexer of the logic path of the ring oscillator circuit, and receiving measurement signals generated by the ring oscillator circuits in the test mode.

Although the invention has been shown and described primarily with reference to specific embodiments, it should be understood by those familiar with the technical field that numerous modifications can be made with regard to configuration and details thereof, without departing from the essence and scope of the invention as defined by the claims hereinafter. The scope of the invention is therefore determined by the appended claims, and the intention is for all modifications to be encompassed which come under the literal meaning or the scope of equivalence of the claims.

What is claimed is:

1. An integrated circuit, comprising:
at least one ring oscillator circuit, comprising:
a plurality of logic paths, wherein each logic path comprises a path input connection, a path output connection and an input multiplexer, which has an output connection that is connected to the path input connection of the logic path,
wherein a first logic path of the plurality of logic paths has a path output connection connected to a data input connection of the input multiplexer of a subsequent logic path, and wherein the subsequent logic path has a path output connection connected to a data input connection of the input multiplexer of a last logic path of the plurality of logic paths, and wherein the last logic path has a path output connection connected to a data input connection of the input multiplexer of the first logic path; and
wherein, for each logic path, the input multiplexer is configured such that, when a control signal that indicates a test mode is fed thereto, the input multiplexer connects the data input connection of the input multiplexer to the path input connection of the logic path.

2. The integrated circuit as claimed in claim 1, wherein each logic path comprises a chain of a plurality of logic gates connected one behind the other and/or comprises a data bus line.

3. The integrated circuit of claim 1, wherein the input multiplexer comprises another data input connection configured such that, when a control signal that indicates a normal operating mode is fed thereto, the input multiplexer connects the other data input connection to the path input connection of the logic path.

4. The integrated circuit of claim 1, wherein the input multiplexer is a 2-to-1 multiplexer.

5. The integrated circuit of claim 1, wherein the at least one ring oscillator circuit comprises a test output connection and the integrated circuit comprises a test terminal to which the test output connection is connected.

6. The integrated circuit of claim 5, wherein the test output connection is arranged at a link between one of the logic paths and the subsequent logic path.

7. The integrated circuit of claim 1,
wherein each logic path of the plurality of logic paths comprises a chain of a plurality of logic gates connected in series with one other and wherein the at least one ring oscillator circuit is assigned to one or more scan flip-flops, which are connected to input connections of at least a portion of the logic gates of the chains of logic gates of the ring oscillator circuit and are configured such that, when the one or more scan flip-flops store a predefined side input pattern, for each logic path of the ring oscillator circuit, the logic gates of the chain of the logic path form a serial 1-bit logic path from an input connection of a first logic gate of the chain of the logic path to the output connection of a last logic gate of the chain of the logic path.

8. The integrated circuit of claim 1, wherein each logic path is assigned a scan flip-flop group, which contains at least one scan flip-flop, wherein at least one scan flip-flop of the scan flip-flop group is connected to a second data input connection of the input multiplexer of the logic path.

9. The integrated circuit of claim 1, comprising a multiplicity of ring oscillator circuits, wherein each ring oscillator circuit comprises:
a plurality of logic paths, wherein each logic path comprises a path input connection, a path output connection and an input multiplexer, which has an output connection that is connected to the path input connection of the logic path, wherein a first logic path of the plurality of logic paths has a path output connection connected to a data input connection of the input multiplexer of a subsequent logic path, and wherein the subsequent logic path has a path output connection connected to a data input connection of the input multiplexer of a last logic path of the plurality of logic paths, and wherein the last logic path has a path output connection connected to a data input connection of the input multiplexer of the first logic path;

wherein, for each logic path, the input multiplexer is configured such that, when a control signal that indicates a test mode is fed thereto, the input multiplexer connects the data input connection of the input multiplexer to the path input connection of the logic path.

10. The integrated circuit as claimed in claim 9, wherein each logic path of each ring oscillator circuit is assigned a scan flip-flop group, which contains at least one scan flip-flop, wherein the at least one scan flip-flop of the scan flip-flop group is connected to a second data input connection of the input multiplexer of the logic path, wherein the logic paths of different ring oscillator circuits are assigned different scan flip-flop groups.

11. A test assembly for testing the integrated circuit of claim 10, which is configured, for each ring oscillator circuit and each logic path, to feed the control signal that indicates the test mode to the input multiplexer of the logic path of the ring oscillator circuit and to receive measurement signals generated by the ring oscillator circuits in the test mode.

12. The test assembly as claimed in claim 11, comprising an analysis device configured to ascertain a performance of the integrated circuit from oscillation frequencies of the measurement signals received.

13. A method for testing the integrated circuit of claim 10, comprising:

for each ring oscillator circuit and each logic path, feeding the control signal that indicates the test mode to the input multiplexer of the logic path of the ring oscillator circuit, and receiving measurement signals generated by the ring oscillator circuits in the test mode.

14. An integrated circuit, comprising:

a first multiplexer comprising a first first multiplexer input, a second first multiplexer input, a first multiplexer output, and a first multiplexer control;

a first logic path comprising a first logic path input and a first logic path output, the first logic path input coupled to the first multiplexer output;

a second multiplexer comprising first second multiplexer input, a second second multiplexer input, a second multiplexer output, and a second multiplexer control, the second multiplexer control coupled to the first multiplexer control and the first second multiplexer input coupled to the first logic path output;

a second logic path comprising a second logic path input and a second logic path output, the second logic path input coupled to the second multiplexer output and the second logic path output coupled to the second first multiplexer input;

a first input scan flip-flop comprising a first input scan flip-flop input and a first input scan flip-flop output, the first input scan flip-flop output coupled to the first first multiplexer input; and a second input scan flip-flop comprising a second input scan flip-flop input and a second input scan flip-flop output, the second input scan flip-flop output coupled to the second second multiplexer input.

15. The integrated circuit of claim 14:

wherein the first logic path comprises a first number of logic gates arranged in series with one another and having respective first side inputs by which the first number of logic gates can be configured as a first number of inverters; and wherein the second logic path comprises a second number of logic gates arranged in series with one another and having respective second side inputs by which the second number of logic gates can be configured as a second number of inverters; and wherein the first number plus the second number is an odd integer.

16. The integrated circuit of claim 14:

wherein, when the first multiplexer control and the second multiplexer control are set to a first state, the first logic path and the second logic path are connected together as a single loop corresponding to a ring oscillator; and wherein, when the first multiplexer control and the second multiplexer control are set to a second state that differs from the first state, the first logic path and the second logic path are separate logical paths.

17. The integrated circuit of claim 14, further comprising:

a first output scan flip-flop comprising a first output scan flip-flop input and a first output scan flip-flop output, the first logic path output coupled to the first output scan flip-flop input and the first second multiplexer input; and a second output scan flip-flop comprising a second output scan flip-flop input and a second output scan flip-flop output, the second logic path output coupled to the second output scan flip-flop flip-flip input and the second first multiplexer input.

18. An integrated circuit, comprising an oscillator circuit, comprising:

a first input scan flip-flop comprising a first input scan flip-flop input and a first input scan flip-flop output;

a first multiplexer comprising a first first multiplexer input, a second first multiplexer input, and a first multiplexer output, the first first multiplexer input coupled to the first input scan flip-flop output;

a first output scan flip-flop comprising a first output scan flip-flop input and a first output scan flip-flop output;

a first logic path comprising a first logic path input and a first logic path output, the first logic path input coupled to the first multiplexer output and the first logic path output coupled to the first output scan flip-flop input;

a second input scan flip-flop comprising a second input scan flip-flop input and a second input scan flip-flop output;

a second multiplexer comprising a first second multiplexer input, a second second multiplexer input, and a second multiplexer output, the first second multiplexer input coupled to the second input scan flip-flop output;

a second output scan flip-flop comprising a second output scan flip-flop input and a second output scan flip-flop output;

a second logic path comprising a second logic path input connection and a second logic path output, the second logic path input connection coupled to the second multiplexer output and the second logic path output coupled to the second output scan flip-flop input;

a first line coupling the second logic path output to the second first multiplexer input; and a second line coupling the first logic path output to the first second multiplexer input.

19. The integrated circuit of claim 18:

wherein the first logic path comprises a first number of logic gates arranged in series with one another and having respective first side inputs by which the first number of logic gates can be configured as a first number of inverters; and wherein the second logic path comprises a second number of logic gates arranged in series with one another and having respective second side inputs by which the second number of logic gates can be configured as a second number of inverters; and wherein the first number plus the second number is an odd integer.

20. The integrated circuit of claim 18, wherein when a first control terminal of the first multiplexer is coupled to a second control terminal of the second multiplexer, and when the first and second control terminals are set to a first state, the first logic path and the second logic path are connected together as a single loop corresponding to a ring oscillator; and wherein when the first and second control terminals are set to a second state that differs from the first state, the first logic path and the second logic path are separate logical paths.

* * * * *